(12) United States Patent
Hsueh et al.

(10) Patent No.: US 8,662,715 B2
(45) Date of Patent: Mar. 4, 2014

(54) OPTICAL LENS MODULE AND LIGHTING APPARATUS HAVING THE SAME

(75) Inventors: Han-Tsung Hsueh, New Taipei (TW); Jia-Chyi Feng, New Taipei (TW); Shih-Feng Chen, New Taipei (TW)

(73) Assignees: Cal-Comp Electronics & Communications Company Limited, New Taipei (TW); Kinpo Electronics, Inc., New Taipei (TW)

( * ) Notice: Subject to any disclaimer, the term of this patent is extended or adjusted under 35 U.S.C. 154(b) by 159 days.

(21) Appl. No.: 13/310,341

(22) Filed: Dec. 2, 2011

(65) Prior Publication Data
US 2012/0155092 A1    Jun. 21, 2012

(30) Foreign Application Priority Data
Dec. 15, 2010   (TW) ................ 99143943 A

(51) Int. Cl.
*F21V 5/00*   (2006.01)
(52) U.S. Cl.
USPC .............. 362/336; 362/311.02; 362/309
(58) Field of Classification Search
USPC ............ 362/336, 311.02, 307, 309, 334
See application file for complete search history.

(56) References Cited

U.S. PATENT DOCUMENTS

| | | | |
|---|---|---|---|
| 6,543,911 B1 * | 4/2003 | Rizkin et al. | 362/307 |
| 7,744,246 B2 * | 6/2010 | Rizkin et al. | 362/245 |
| 8,118,457 B2 * | 2/2012 | Kanai | 362/327 |
| 8,292,471 B2 * | 10/2012 | Boonekamp et al. | 362/311.02 |
| 2008/0212328 A1 * | 9/2008 | Minano et al. | 362/309 |
| 2010/0165637 A1 * | 7/2010 | Premysler | 362/308 |
| 2012/0140486 A1 * | 6/2012 | Chou | 362/311.02 |

* cited by examiner

*Primary Examiner* — Mary Ellen Bowman
(74) *Attorney, Agent, or Firm* — Li & Cai Intellectual Property (USA) Office

(57) ABSTRACT

An optical lens module includes a lens body and a transflective unit. The lens body has a central axis, and has an incident surface, a refractive surface and a side refractive surface. The refractive surface includes a refractive arc-surface and at least one auxiliary refractive surface on the side of the refractive arc-surface. The transflective unit covers the refractive surface. The light incident on the refractive surface is diverged away from the central axis and the diverged light on the transflective unit is partially through the transflective unit and partially reflected to travel out of the lens body through the side refractive surface. The light incident on the transflective unit is reflected to travel out of the lens body through the side refractive surface. The light incident on the side refractive surface is refracted out of the lens body through the side refractive surface.

30 Claims, 20 Drawing Sheets

OPTICAL LENS MODULE AND LIGHTING APPARATUS HAVING THE SAME

CROSS-REFERENCE TO RELATED APPLICATION

This application claims the priority benefit of Taiwan application serial no. 99143943, filed on Dec. 15, 2010. The entirety of the above-mentioned patent application is hereby incorporated by reference herein and made a part of specification.

BACKGROUND OF THE INVENTION

1. Field of the Invention

The present invention relates to an optical lens module. In particular, the present invention relates to an optical lens module and a lighting apparatus having the same, which is capable of providing even light distribution.

2. Description of Related Art

LEDs are recently applied in display and lighting applications because of advantages such as high efficiency and long life-time. For example, the LED products may have one or more light emitting diodes which have green, red and blue lights to mix and form white light illumination.

However, as LED is a form of directional light source, the light-emitting characteristic of LED is similar to spotlights, which acts a point light source that projects light toward a specific direction, thus often resulting in uneven illumination and forming dark regions. Thus, conventional LED lighting devices often employ additional optical components (such as reflectors) in the front of the optical axis of the LED to provide modification/adjustment to the illuminating range/pattern. However, the dark portions due to uneven illumination can only be reduced but not completely eliminated. Due to these reasons, lighting apparatus made from LED is conventionally used on partial lighting, such as commerce projections, spotlights, directional lights and etc., remain incapable to apply to offices and homes.

To solve the above disadvantage, a specific lens is provided, which has a reflection film thereon by a coating method. The lens is used to reflect the light incident on the reflection film to a perpendicular angle with respect to the light axis and thus the light distributes between ±90 degree. However, the light energy between 0 to ±70, ±120 to ±180 degree is consumed; thus the light pattern is un-uniform. In other words, the issue of the dark regions still occurs.

Therefore, increasing the angle of illumination of LED products effectively to meet the requirement of general applications was deemed the major object of researching.

SUMMARY OF THE INVENTION

The instant disclosure provides an optical lens module comprising a lens body and a transflective unit. The lens body has a central axis. The lens body has an incident surface on the bottom portion thereof, a refractive surface on the top portion thereof and a side refractive surface on the side portion thereof, the refractive surface includes a refractive arc-surface and at least one auxiliary refractive surface formed on the side of the refractive arc-surface. The transflective unit is disposed on the lens body and covers the refractive surface. The light incident on the refractive surface is diverged away from the central axis and the diverged light on the transflective unit is partially through the transflective unit and partially reflected to travel out of the lens body through the side refractive surface. The light incident on the transflective unit is reflected to travel out of the lens body through the side refractive surface. The light incident on the side refractive surface is refracted out of the lens body through the side refractive surface.

The instant disclosure provides a lighting apparatus comprising a base having a lighting element and an optical lens module assembled on the base and corresponding to the lighting element. The optical lens module comprising a lens body and a transflective unit. The lens body has a central axis. The lens body has an incident surface on the bottom portion thereof, a refractive surface on the top portion thereof and a side refractive surface on the side portion thereof, the refractive surface includes a refractive arc-surface and at least one auxiliary refractive surface formed on the side of the refractive arc-surface. The transflective unit is disposed on the lens body and covers the refractive surface. The light emitted by the lighting element and incident on the refractive surface is diverged away from the central axis and the diverged light on the transflective unit is partially through the transflective unit and partially reflected to travel out of the lens body through the side refractive surface. The light emitted by the lighting element and incident on the transflective unit is reflected to travel out of the lens body through the side refractive surface. The light emitted by the lighting element and incident on the side refractive surface is refracted out of the lens body through the side refractive surface.

Due to the transflective unit and the lens body having specific structure, the light is diverged out of the lens body in great angles. In other words, the requirement of the large view angle and the uniform light pattern can be met according to the instant disclosure. Furthermore, the floodlight illumination is achieved.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

The present invention provides an optical lens module and a lighting apparatus. By using the optical lens module of the instant disclosure, the projected light of the lighting apparatus has a floodlight effect, i.e., an even light distribution. In other words, the projected light of the lighting apparatus has a uniform light-pattern. Therefore, the light of a directional light source is adjusted to have a floodlight illumination and an even light distribution.

Figure 1:
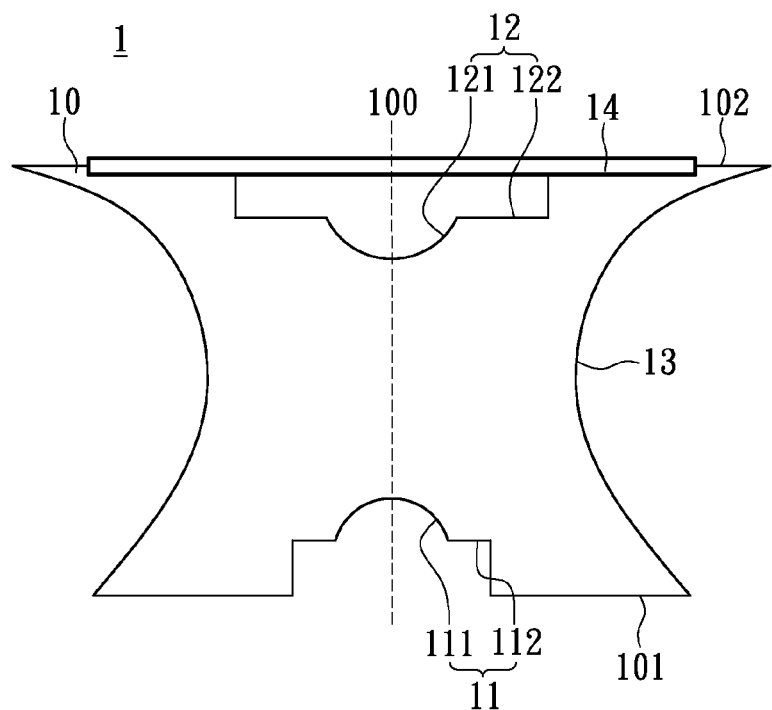
FIG. 1 shows the lens body of the first embodiment of the instant disclosure.
Figure 1A:
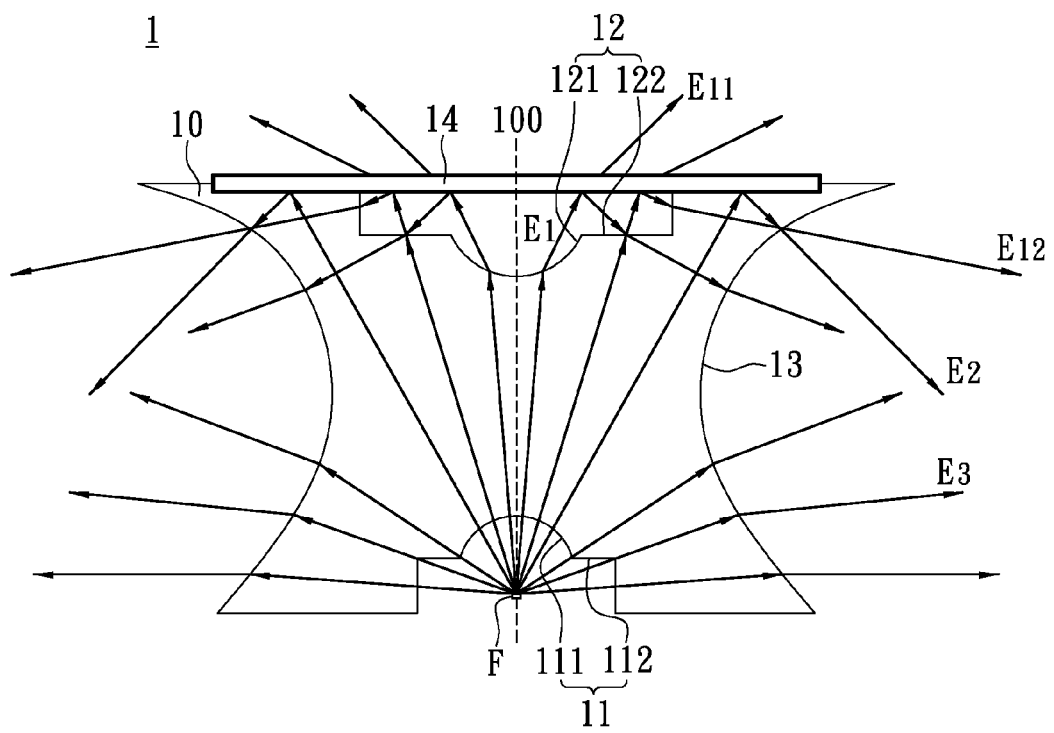
FIG. 1A shows the light traces travel in the lens body of the first embodiment of the instant disclosure.

Please refer to FIGS. 1 and 1A; the optical lens module 1 of the first embodiment of the instant disclosure is shown. The optical lens module 1 at least includes a lens body 10 and a transflective unit 14 disposed on the lens body 10. The lens body 10 includes an incident surface 11, a refractive surface 12 and a side refractive surface 13.

In the exemplary embodiment, the lens body 10 has a bottom portion 101 and a top portion 102. Furthermore, a central axis 100 is defined through the bottom portion 101 and the top portion 102. The lens body 10 is preferably a cylinder-type lens that is similar with a lenticular lens. In other words, the incident surface 11, the refractive surface 12 and the side refractive surface 13 respectively have rotational and axial symmetry with respect to the central axis 100. The illustrated drawings simply show the planar view of the lens body 10 and the lens body 10 is actually a three-dimensional and symmetric structure.

The lens body 10 may be formed by an insert-molding method or a compression casting method. Preferably, the lens body 10 is a single and integrated optical element. Alternatively, the lens body 10 may be an assembled optical element. The lens body 10 is a transparent lens or a light transmissive lens, which is made of PMMA (polymethylmethacrolate), PC (ploycarbonate), a mixture of PMMA and PC, PEI (polyetherimide), silicon resin, fluorocarbon polymer, glass materials and so on. In the embodiment, the refractive index is ranged from 1.35 to 1.7.

In structural detail, the lens body 10 has an incident surface 11 and a refractive surface 12 respectively formed on the bottom portion 101 and the top portion 102 thereof. The lens body 10 further has a side refractive surface 13 on the lateral side portion. The incident surface 11 is formed as a concave down on the lens body 10 and the refractive surface 12 is formed as a concave up on the lens body 10 to diverge or spread the lights passing through the refractive surface 12 far away from the central axis 100 of the lens body 10. The diverged lights are further diverged while passing through the side refractive surface 13 and then project out of the lateral portion of the lens body 10. In the embodiment, the refractive surface 12 corresponds to the incident surface 11 and has a refractive arc-surface 121 and at least one auxiliary refractive surface 122 formed on the side of the refractive arc-surface 121. In structural detail, the refractive arc-surface 121 is formed as a concave up on the lens body 10.

On the other hand, the transflective unit 14 is disposed on the top portion 102 of the lens body 10 and covers the refractive surface 12. The transflective unit 14 may be a metal film, which has specific ratio of reflection/transmission in different film thickness and conductivity index. For example, the reflection ratio of Au film is about 47.7% in wavelength of 500 nm; the reflection ratio of Al film is about 86.7% in wavelength of 800 nm. Alternatively, the transflective unit 14 may be a dielectric film, which provides optical effect of partial reflection and partial transmission. The transflective unit 14 can be used to reflect the lights projecting out of the lens body 10 through the side refractive surface 13 and thus to form a floodlight illumination.

The incident surface 11, as shown in FIG. 1, includes an arc-surface 111 and the incident lights enter into the lens body 10 that is made of PMMA, through the incident surface 11. In further detail, the incident surface 11 includes the arc-surface 111 and at least one step structure 112 at the side of the arc-surface 111. As shown, the step structure 112 has a single-stepped shape. The incident surface 11 is an interface defined between the lens body 10 and a first medium and the refractive index of the lens body 10 is greater than that of the first medium. In the embodiment, the first medium can be air, another gas or transparent resin.

Moreover, the auxiliary refractive surface 122 is a single-stepped structure and the refractive surface 12 is interface defined between the lens body 10 and a second medium and the refractive index of the lens body 10 is greater than that of the second medium. Similarly, the second medium can be air, another gas or transparent resin. Please note that the first and the second medium are the same or different.

The side refractive surface 13 is a smooth curved-surface extending from the bottom portion 101 of the lens body 10 to the top portion 102 of the lens body10. The lights are further diverged outward while passing through the side refractive surface 13 so that the diverged lights project in greater angle to form the floodlight illumination.

Please refer to FIG. 1A; the traces of lights are shown. The trace "E1" shows that light emitted from the focus "F" of the arc-surface 111 enters the lens body 10 through the incident surface 11. After passing through the refractive surface 12, the light is diverged away from the central axis 100 of the lens body 10. Further, the light is partially transmitted through the transflective unit 14 (as referenced as "E11") and partially reflected by the transflective unit 14. The reflected light projects out of the lens body 10 through the side refractive surface 13 (as referenced as "E12"). The trace "E2" shows that light emitted from the focus "F" of the arc-surface 111 enters the lens body 10 and is incident on the transflective unit 14 directly. The light is reflected by the transflective unit 14 and then travels out of the lens body 10 through the side refractive surface 13. Furthermore, the trace "E3" shows that light emitted from the focus "F" of the arc-surface 111 enters the lens body 10 and then directly travels out of the lens body 10 through the side refractive surface 13. Accordingly, the lights incident into the lens body 10 may be diverged and spread in great angle with respect to the central axis 100 so as to form the floodlight illumination.

Figure 1B:
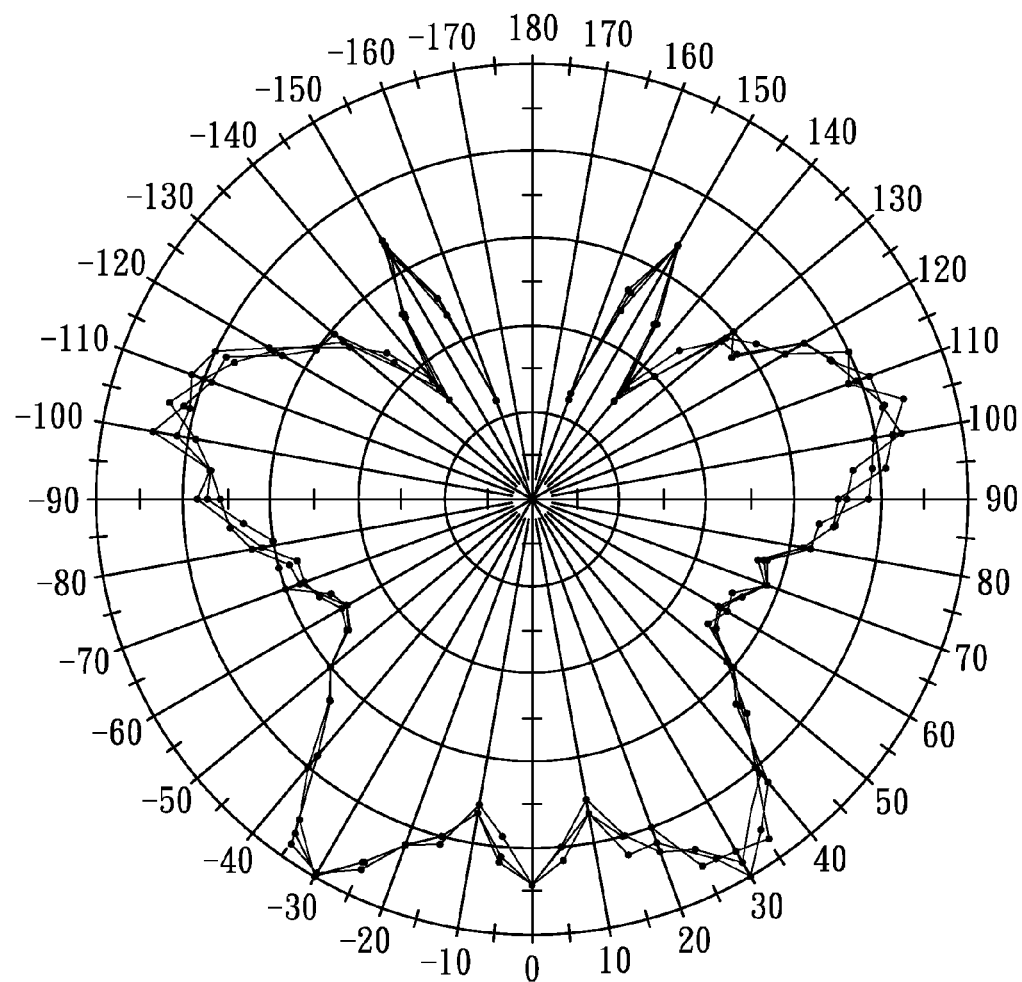
FIG. 1B shows the light pattern in polar coordinate performed by the first embodiment of the instant disclosure.
Figure 1C:
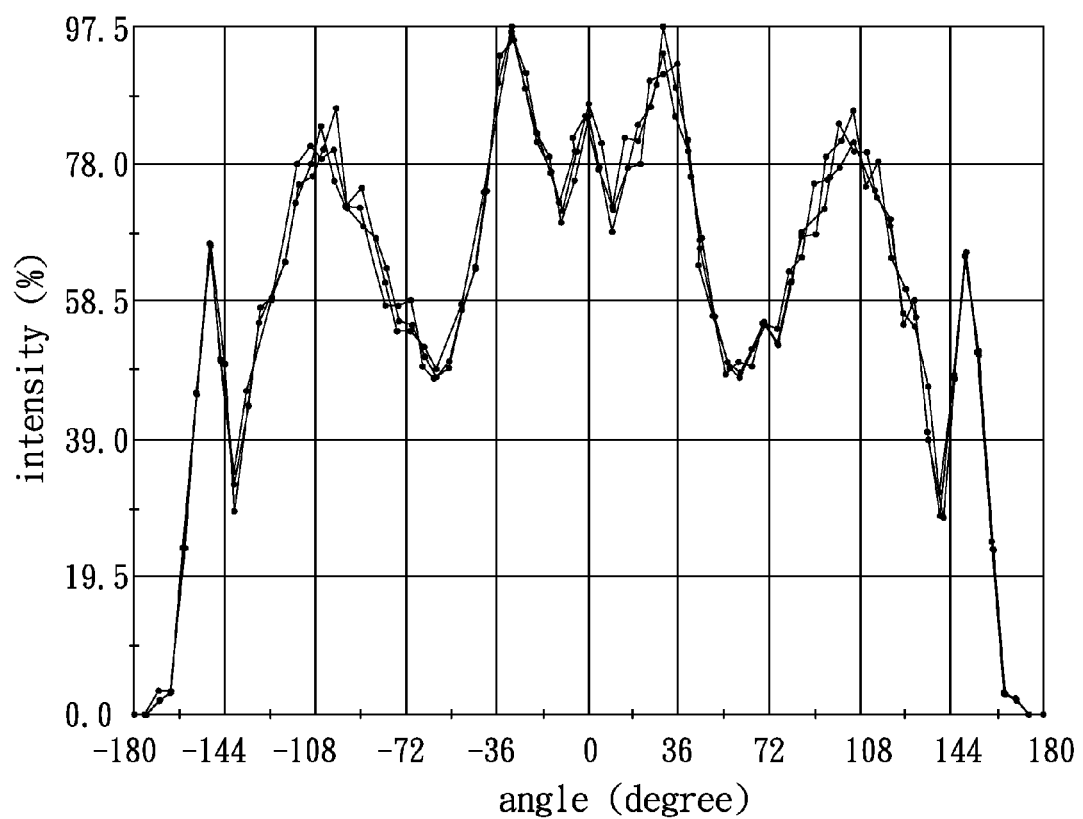
FIG. 1C shows the light pattern in cross-section view performed by the first embodiment of the instant disclosure.

Please refer to FIGS. 1B, 1C with FIG. 1A; by being refracted through the refractive surface 12, the side refractive surface 13 and the transflective unit 14, the lights are diverged and thus distributed between ±90 degree and ±180 degree and preferably are distributed between ±90 degree and ±160 degree so as to form the floodlight illumination. On the other hand, the transflective unit 14 may not "consume" the energy of lights in another angle so that the pattern of the lighting apparatus is more even.

Figure 2:
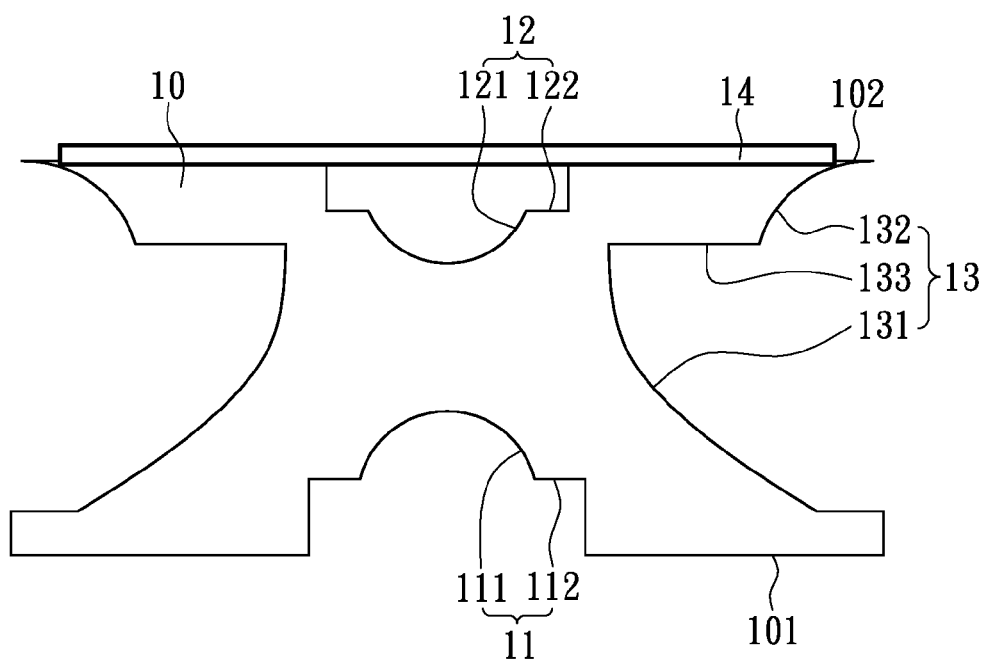
FIG. 2 shows the lens body of the second embodiment of the instant disclosure.
Figure 2A:
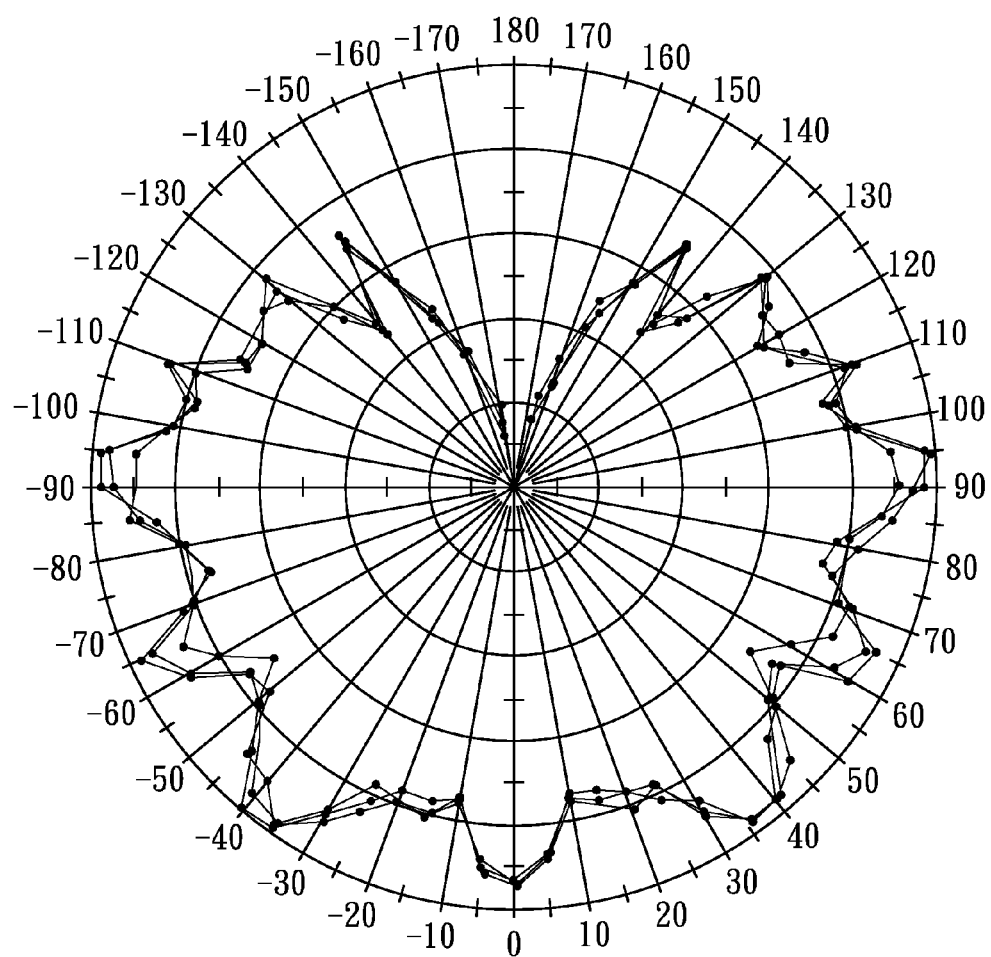
FIG. 2A shows the light pattern in polar coordinate performed by the second embodiment of the instant disclosure, wherein the reflection ratio of the transflective unit is about 55%.
Figure 2B:
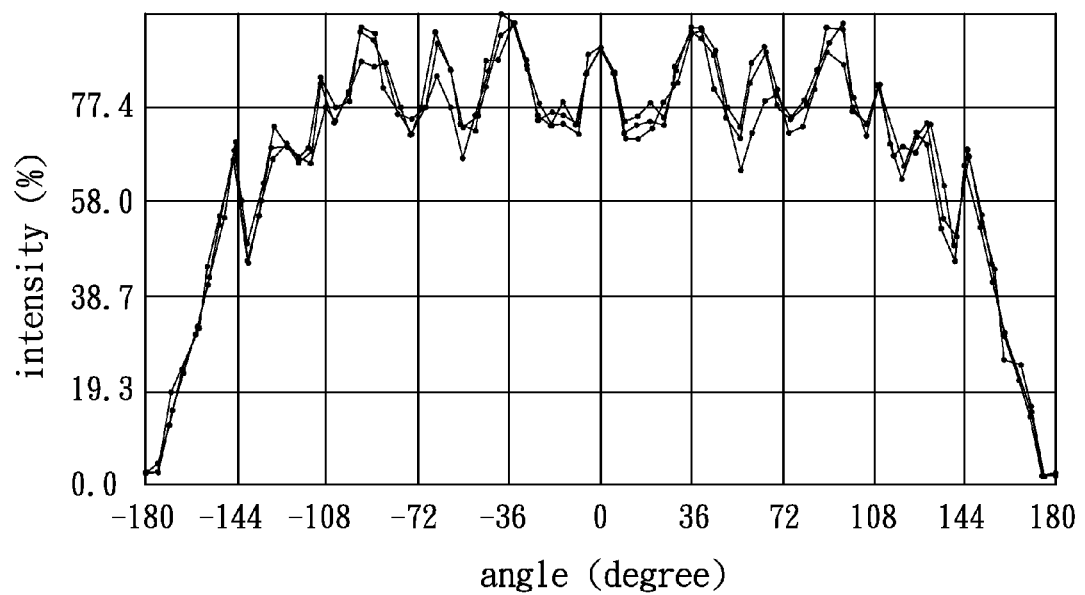
FIG. 2B shows the light pattern in cross-section view performed by the second embodiment of the instant disclosure, wherein the reflection ratio of the transflective unit is about 55%.

Please refer to FIG. 2; the second embodiment of the instant disclosure is shown. The difference between the first and the second embodiment is that the refractive surface 13 has a first curved-surface 131 extending from the bottom portion 101 of the lens body 10 toward the top portion 102 of the lens body 10, a second curved-surface 132 extending from the top portion 102 of the lens body 10 toward the bottom portion 101 of the lens body 10 and a horizontal connection segment 133 between the first curved-surface 131 and the second curved-surface 132. On the other hand, the reflection ratio of the transflective unit 14 is about 55% (i.e., the transmission ratio is about 45%). FIGS. 2A and 2B respectively show the light pattern in polar coordinate and in cross-section view. The results show that the lights are diverged in great angles and between ±90 degree and ±160 degree so that the view angle is greater than ±160 degree. On the other hand, the light density between 0 degree and ±160 degree is 60% or more of the maximum intensity. In other words, the light pattern is even.

Figure 2C:
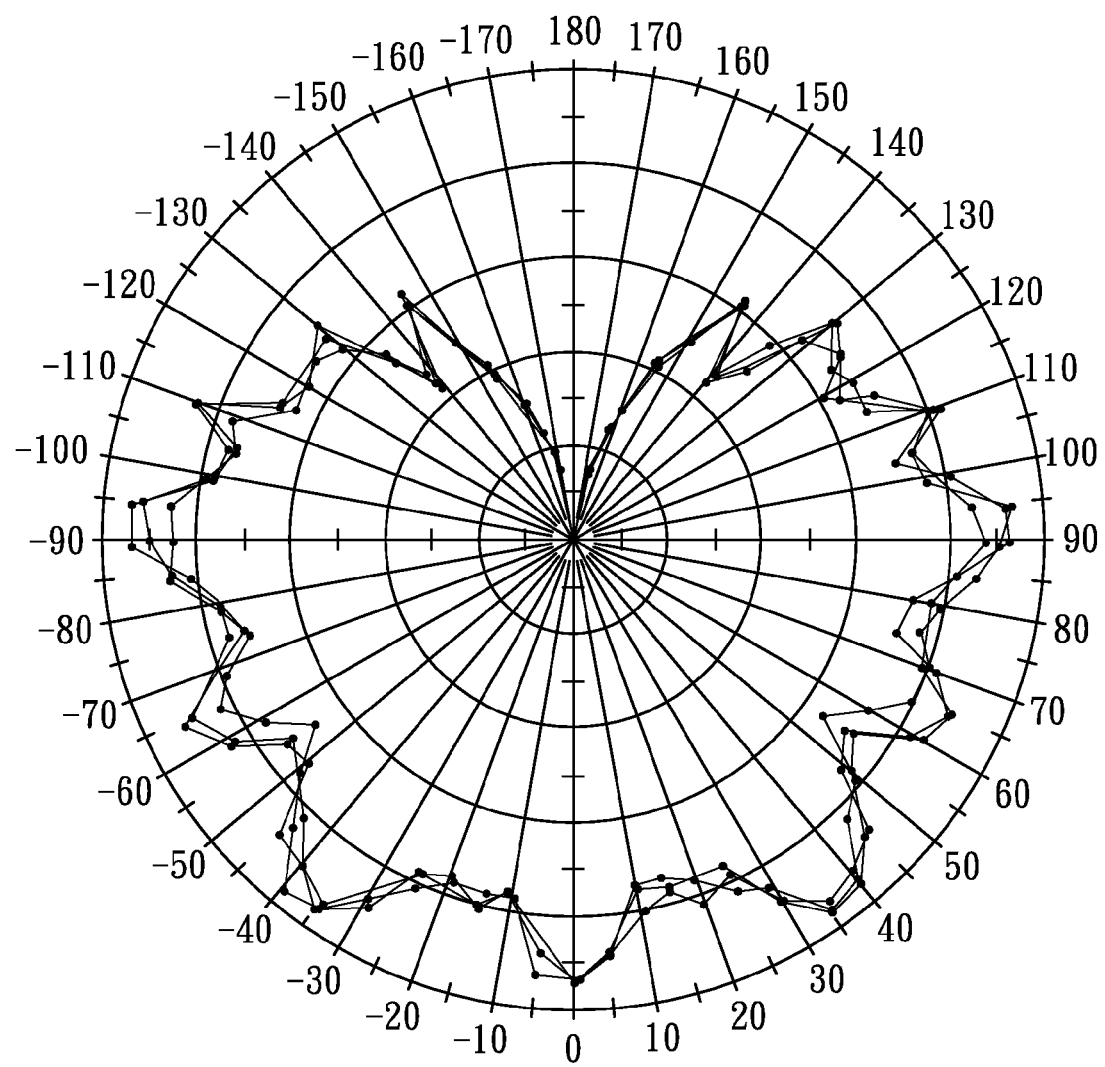
FIG. 2C shows the light pattern in polar coordinate performed by the second embodiment of the instant disclosure, wherein the reflection ratio of the transflective unit is about 50%.
Figure 2D:
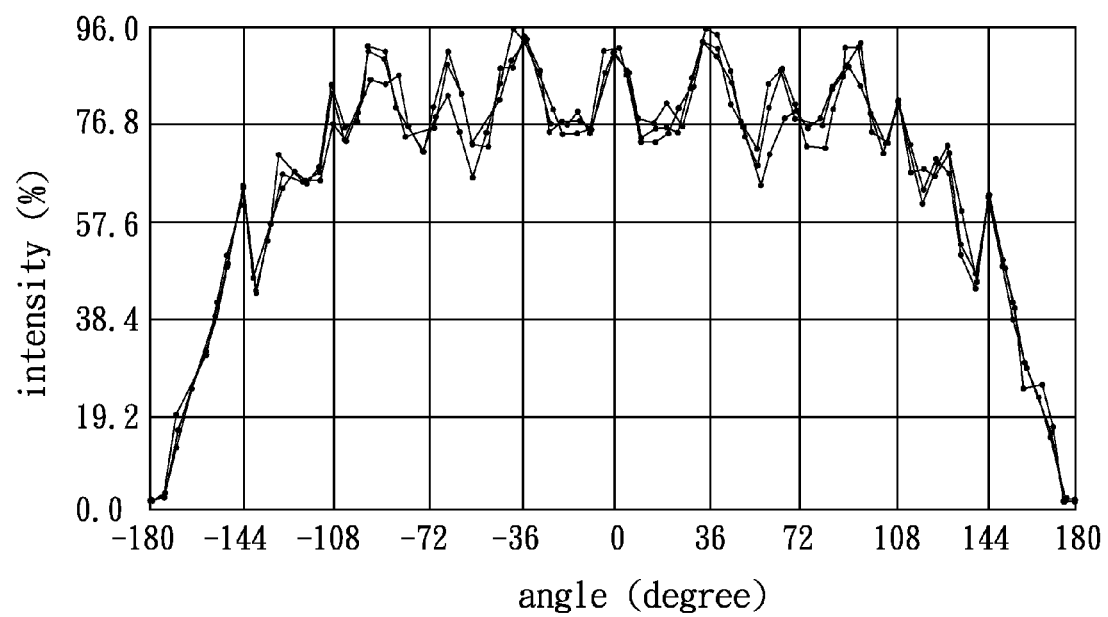
FIG. 2D shows the light pattern in cross-section view performed by the second embodiment of the instant disclosure, wherein the reflection ratio of the transflective unit is about 50%.
Figure 2E:
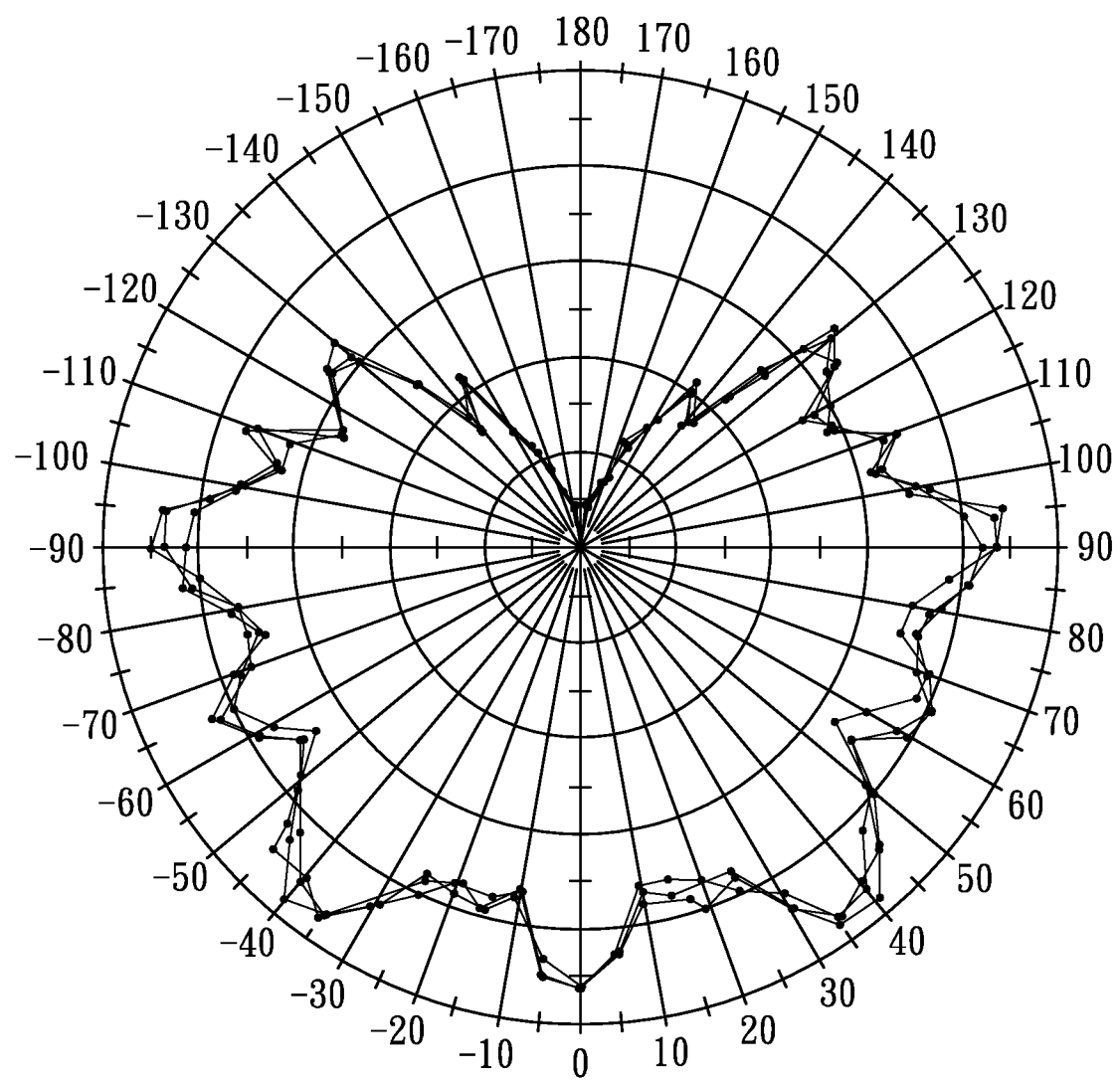
FIG. 2E shows the light pattern in polar coordinate performed by the second embodiment of the instant disclosure, wherein the reflection ratio of the transflective unit is about 30%.
Figure 2F:
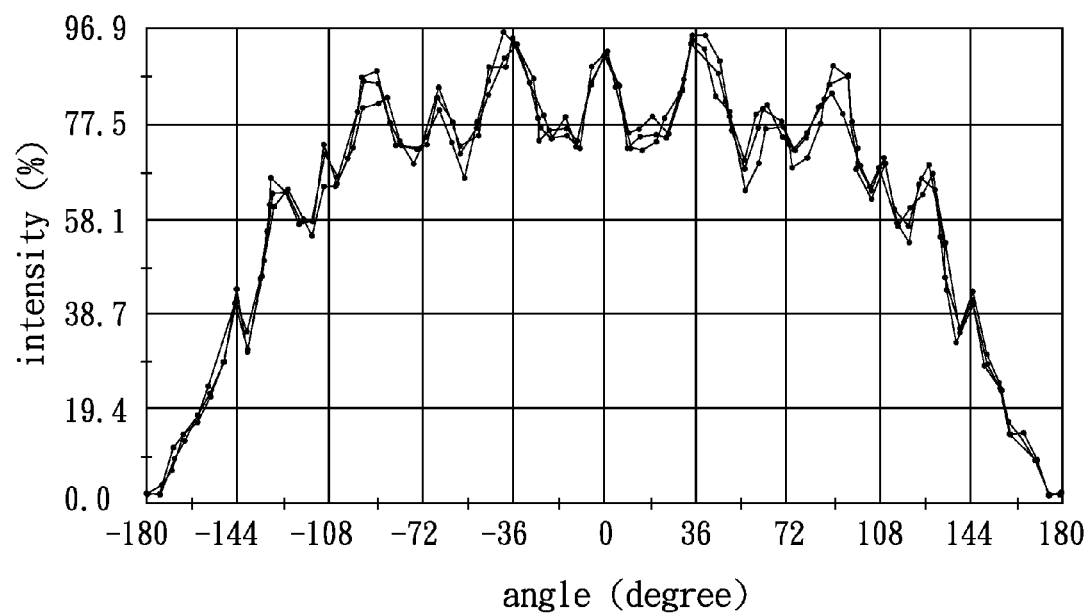
FIG. 2F shows the light pattern in cross-section view performed by the second embodiment of the instant disclosure, wherein the reflection ratio of the transflective unit is about 30%.
Figure 2G:
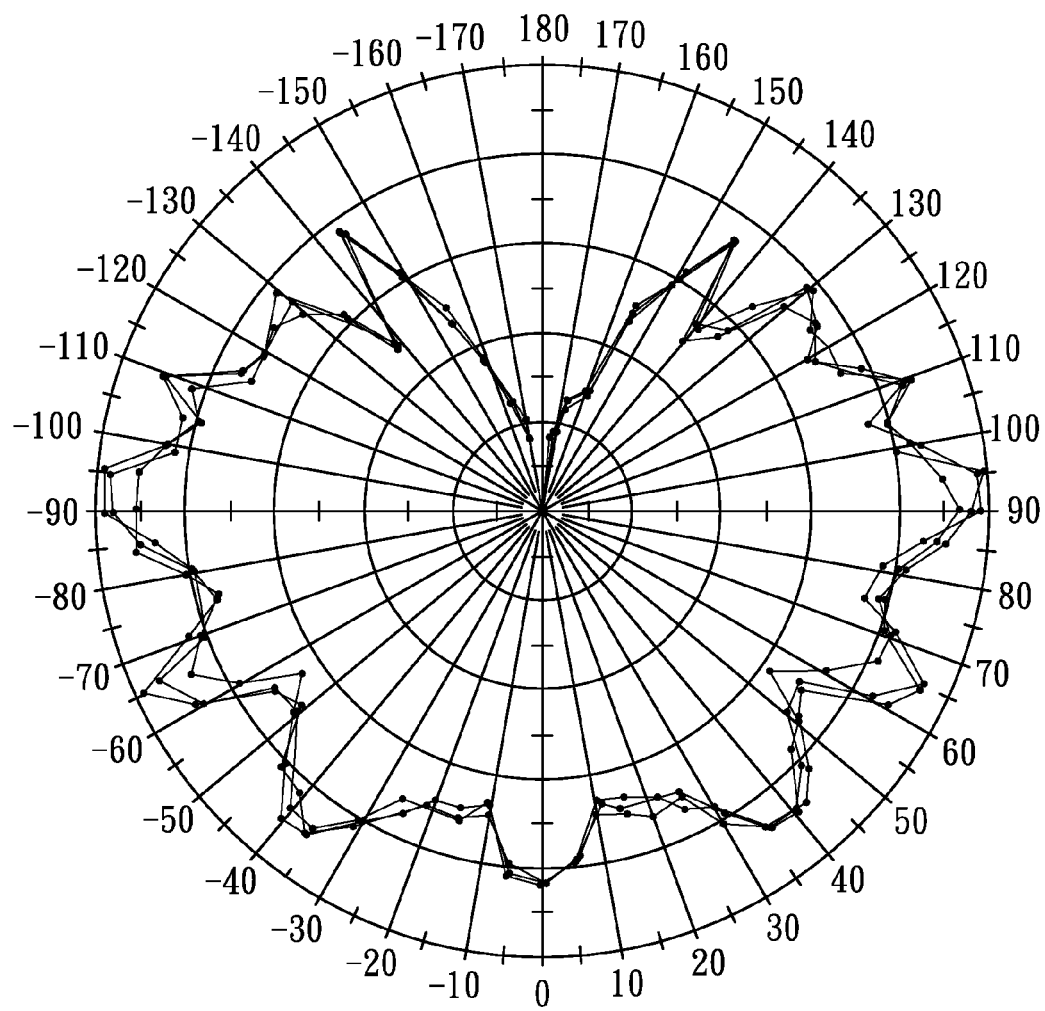
FIG. 2G shows the light pattern in polar coordinate performed by the second embodiment of the instant disclosure, wherein the reflection ratio of the transflective unit is about 60%.
Figure 2H:
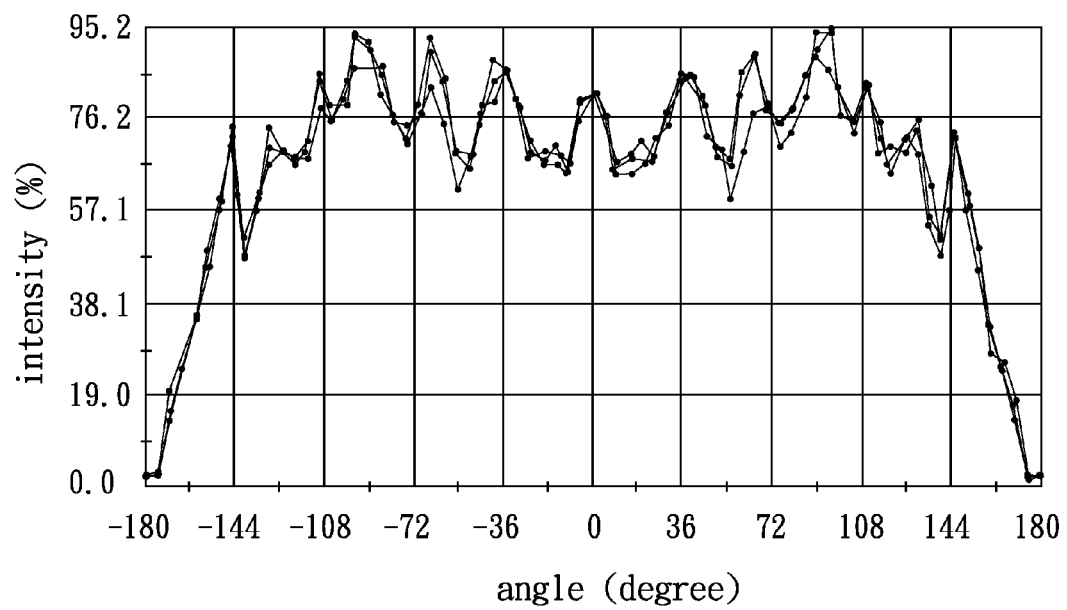
FIG. 2H shows the light pattern in cross-section view performed by the second embodiment of the instant disclosure, wherein the reflection ratio of the transflective unit is about 60%.

FIGS. 2C and 2D respectively show the light pattern in polar coordinate and in cross-section view of another alternative type of the second embodiment. The reflection ratio of the transflective unit 14 is about 50% (i.e., the transmission ratio is about 50%). FIGS. 2E and 2F respectively show the light pattern in polar coordinate and in cross-section view of still another alternative type of the second embodiment. The reflection ratio of the transflective unit 14 is about 30% (i.e., the transmission ratio is about 70%). FIGS. 2G and 2H respectively show the light pattern in polar coordinate and in cross-section view of further another alternative type of the second embodiment. The reflection ratio of the transflective unit 14 is about 60% (i.e., the transmission ratio is about 40%). According to the light patterns of transflective unit 14 having different reflection ratios, the floodlight illumination is achieved. In other words, the light intensity is uniform and the issue of low density in some angles is solved. On the other hand, the reflection ratio of the transflective unit 14 of the instant disclosure may be ranged from 30% to 60%, and preferably is about 55%.

Figure 3:
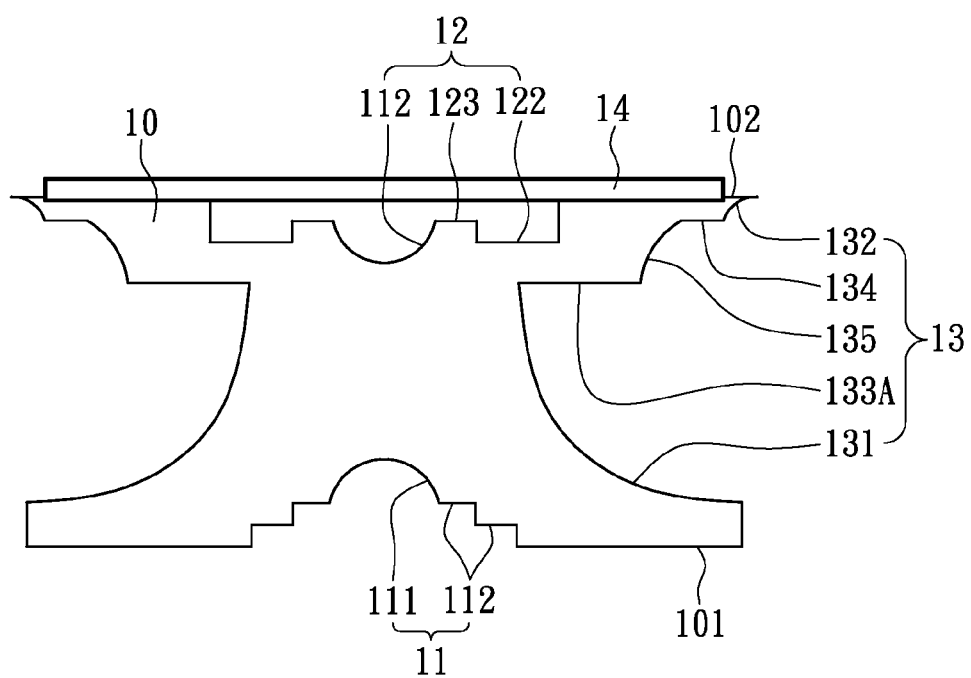
FIG. 3 shows the lens body of the third embodiment of the instant disclosure.

Please refer to FIG. 3; the third embodiment of the instant disclosure is shown. The difference between the first, the second and the third embodiment is that the incident surface 11 includes an arc-surface 111 and a step structure 112 having a two-stepped shape at the side of the arc-surface 111. Furthermore, a refractive protrusion 123 is formed between the refractive arc-surface 121 and the auxiliary refractive surface 122 so that there is a concave-convex structure formed at the side of the refractive arc-surface 121. Still further, the refractive surface 13 has a first curved-surface 131 extending from the bottom portion 101 of the lens body 10 toward the top portion 102 of the lens body 10, a first horizontal connection segment 133A extending from the first curved-surface 131, a second curved-surface 132 extending from the top portion 102 of the lens body 10 toward the bottom portion 101 of the lens body 10 and a second horizontal connection segment 134 extending from the second curved-surface 132 and a third curved-surface 135 connected between the first horizontal connection segment 133A and the second horizontal connection segment 134. The first curved-surface 131, the second curved-surface 132 and the third curved-surface 135 are smooth surfaces.

Figure 3A:
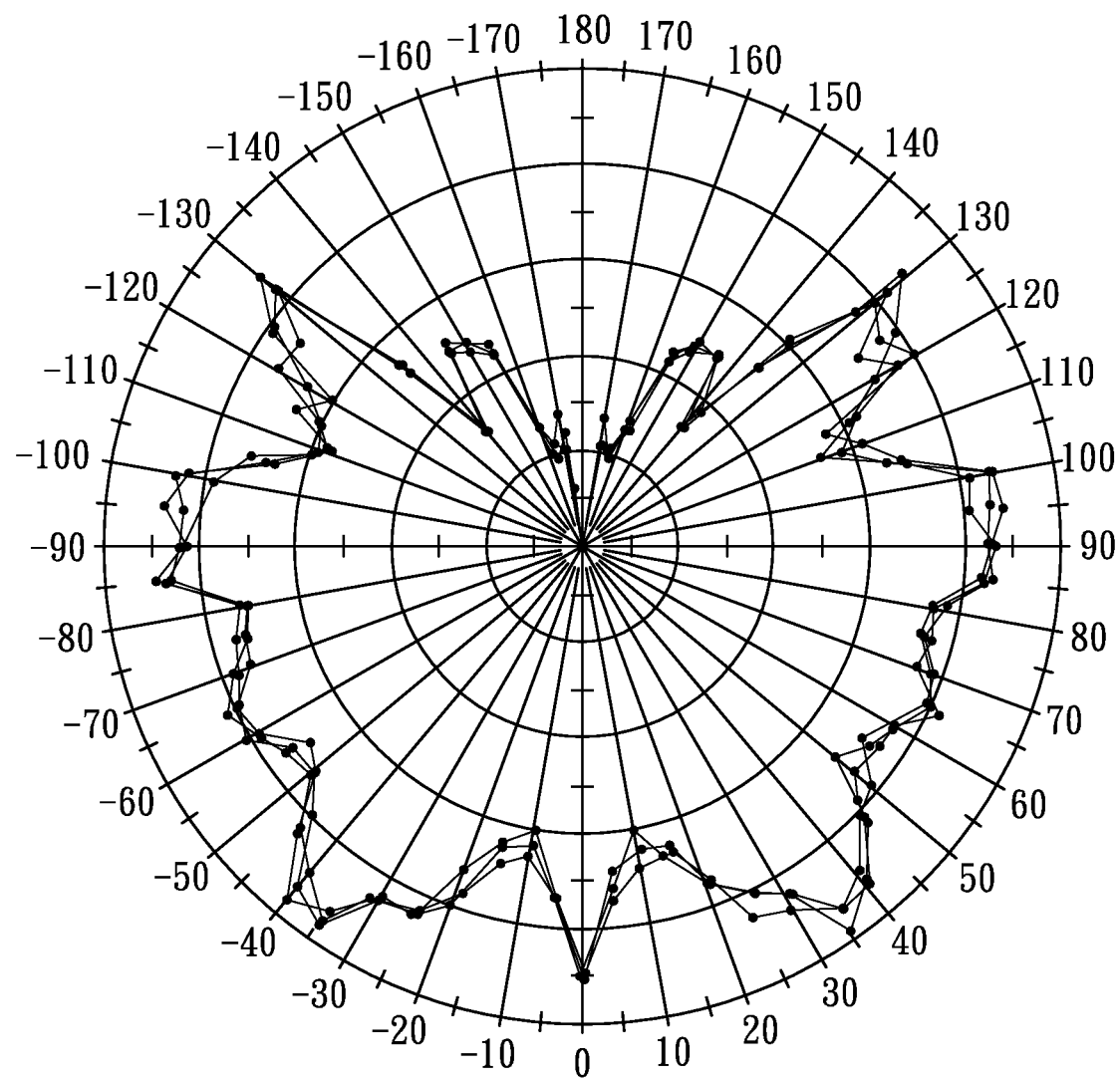
FIG. 3A shows the light pattern in polar coordinate performed by the third embodiment of the instant disclosure, wherein the reflection ratio of the transflective unit is about 50%.
Figure 3B:
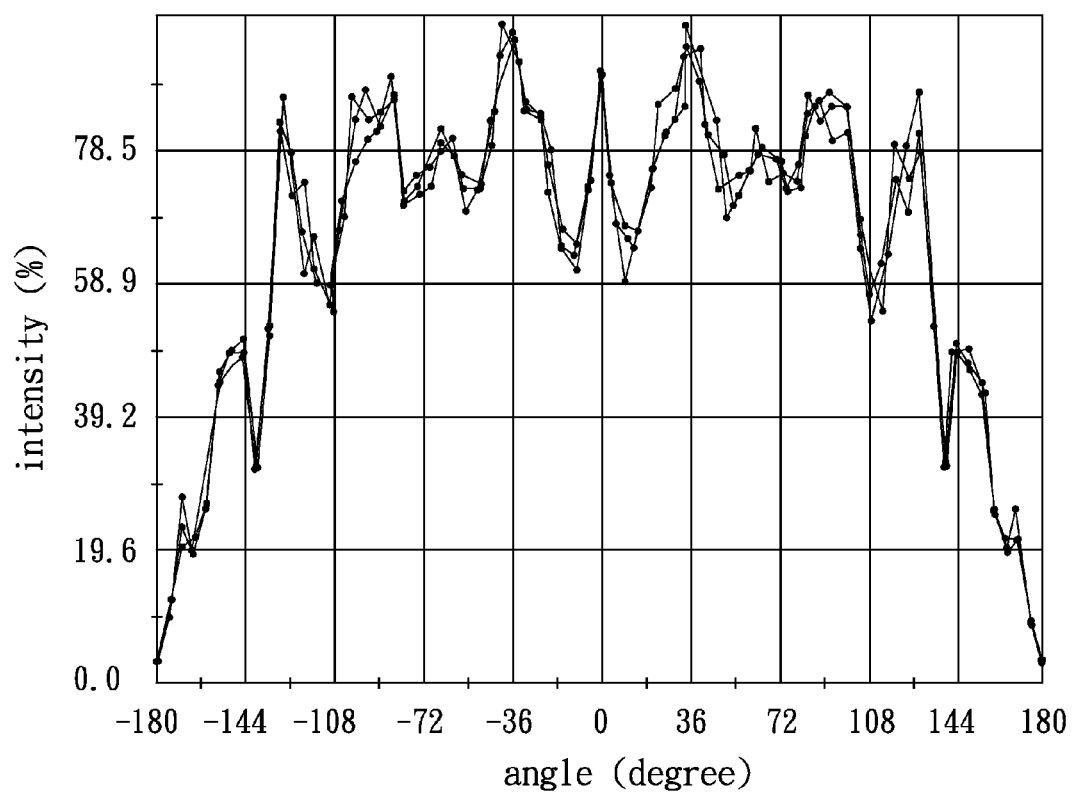
FIG. 3B shows the light pattern in cross-section view performed by the third embodiment of the instant disclosure, wherein the reflection ratio of the transflective unit is about 50%.
Figure 3C:
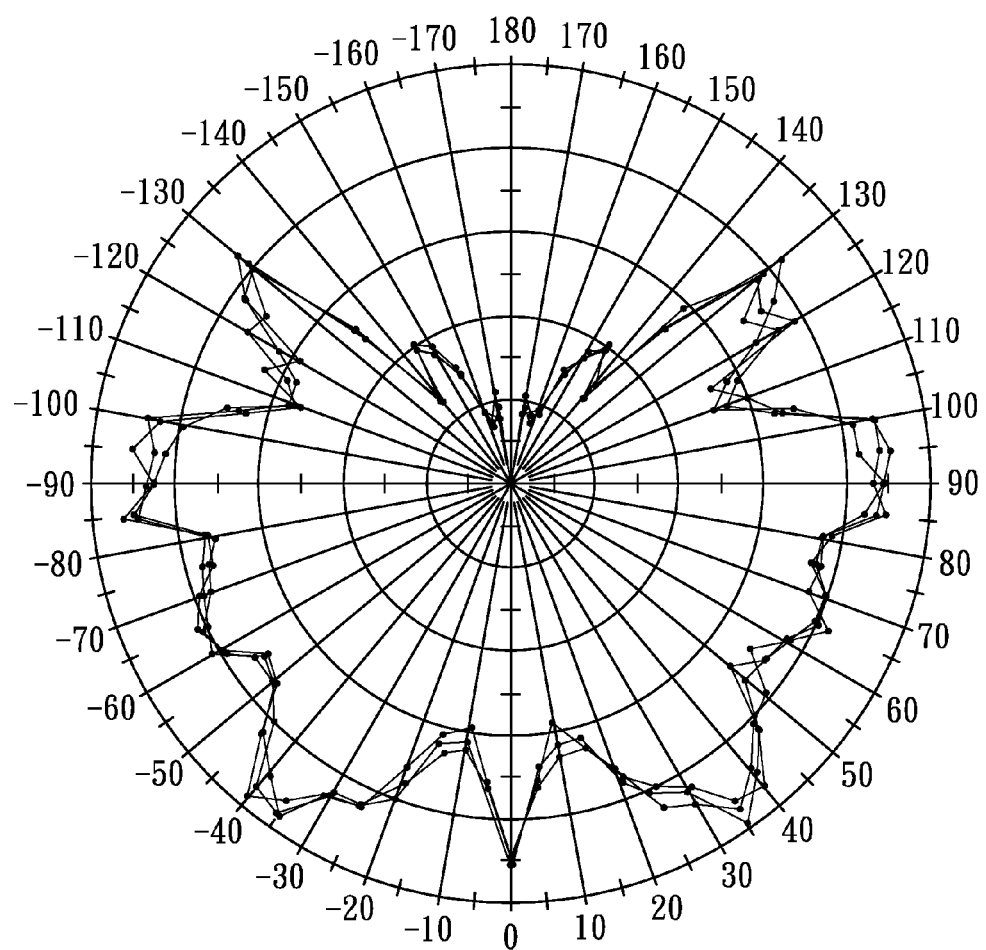
FIG. 3C shows the light pattern in polar coordinate performed by the third embodiment of the instant disclosure, wherein the reflection ratio of the transflective unit is about 30%.
Figure 3D:
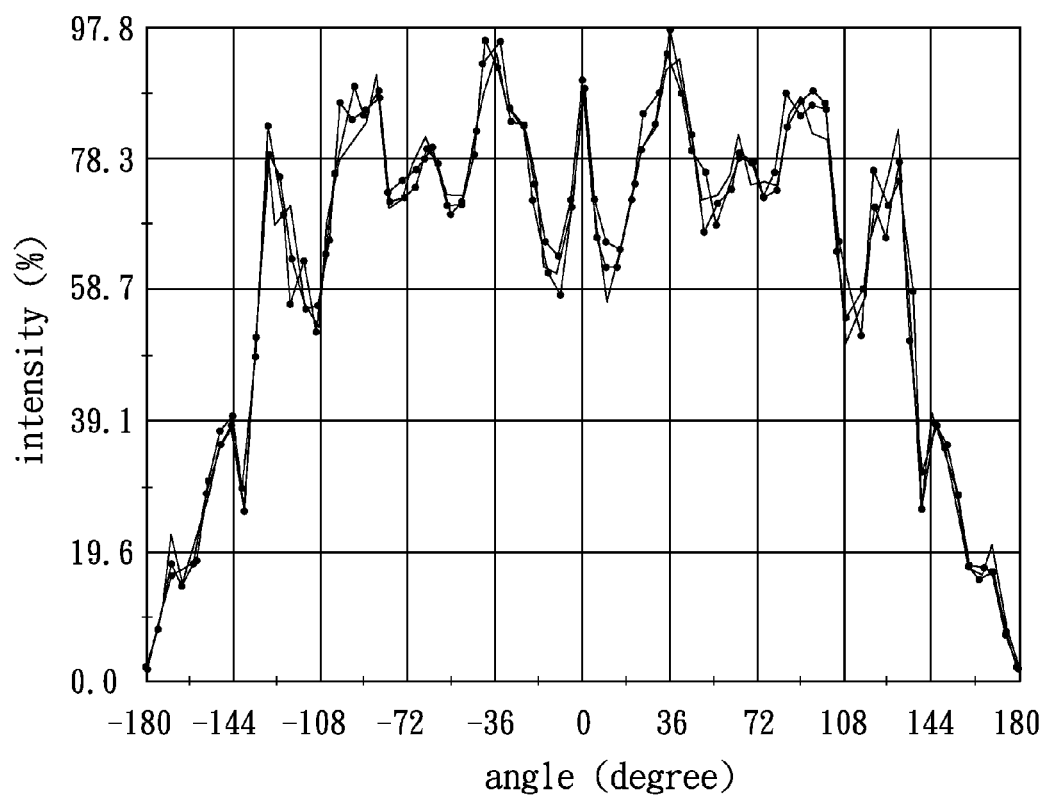
FIG. 3D shows the light pattern in cross-section view performed by the third embodiment of the instant disclosure, wherein the reflection ratio of the transflective unit is about 30%.
Figure 3E:
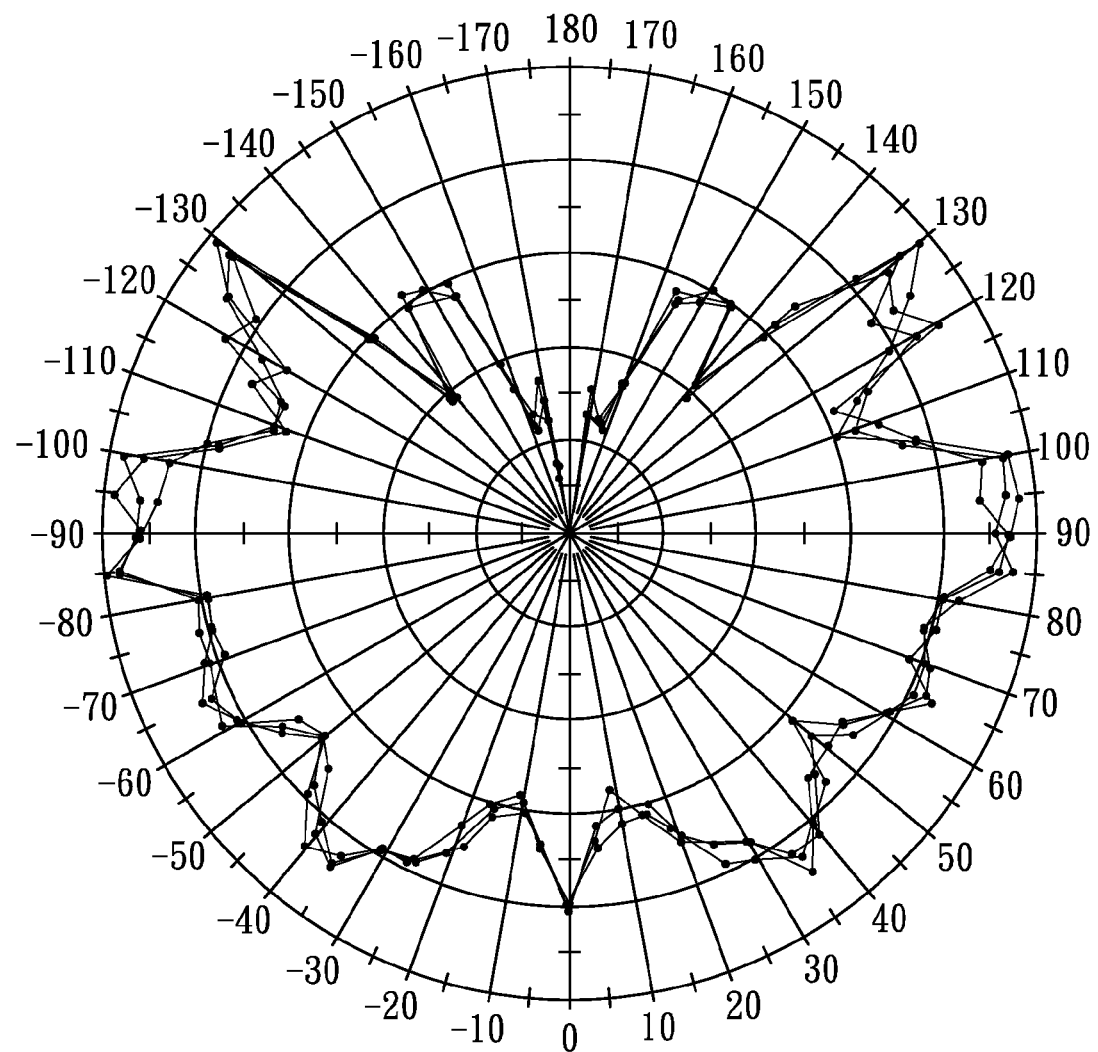
FIG. 3E shows the light pattern in polar coordinate performed by the third embodiment of the instant disclosure, wherein the reflection ratio of the transflective unit is about 60%.
Figure 3F:
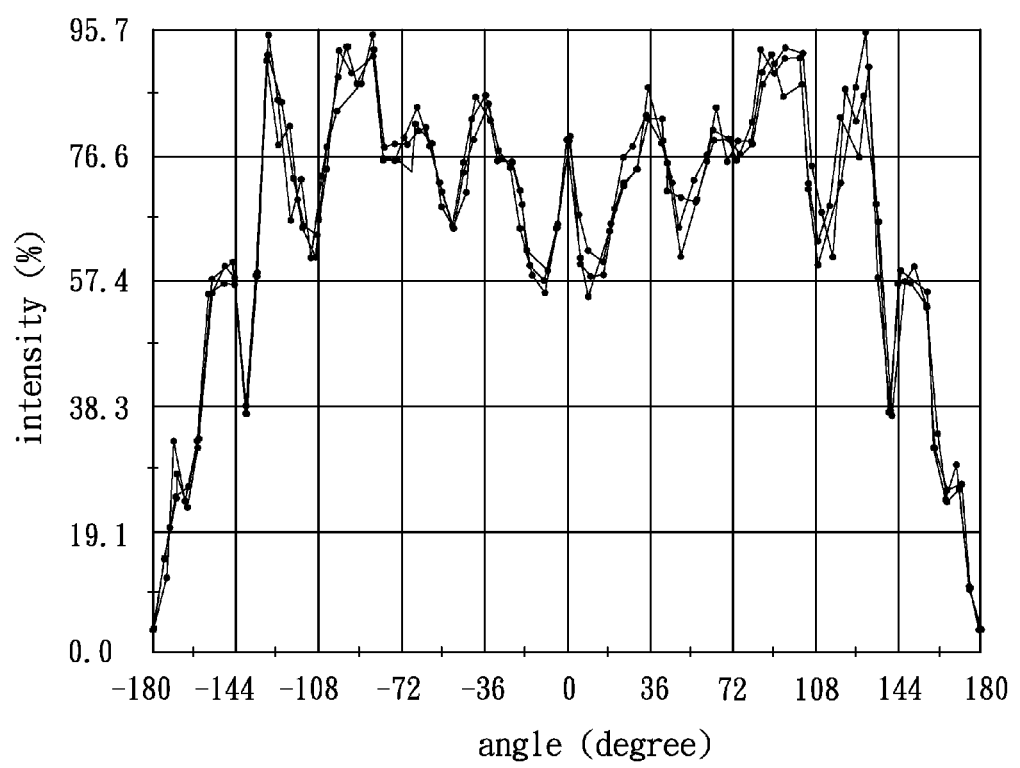
FIG. 3F shows the light pattern in cross-section view performed by the third embodiment of the instant disclosure, wherein the reflection ratio of the transflective unit is about 60%.

FIGS. 3A and 3B respectively show the light pattern in polar coordinate and in cross-section view of the third embodiment in condition that the reflection ratio of the transflective unit 14 is about 50% (i.e., the transmission ratio is about 50%). FIGS. 3C and 3D respectively show the light pattern in polar coordinate and in cross-section view of the third embodiment in condition that the reflection ratio of the transflective unit 14 is about 30% (i.e., the transmission ratio is about 70%). FIGS. 3E and 3F respectively show the light pattern in polar coordinate and in cross-section view of the third embodiment in condition that the reflection ratio of the transflective unit 14 is about 60% (i.e., the transmission ratio is about 40%). According to the light patterns of transflective unit 14 having different reflection ratios, the floodlight illumination is achieved similarly with the first and the second embodiments. In other words, the light intensity is uniform and the issue of low density in some angles is solved.

Figure 4:
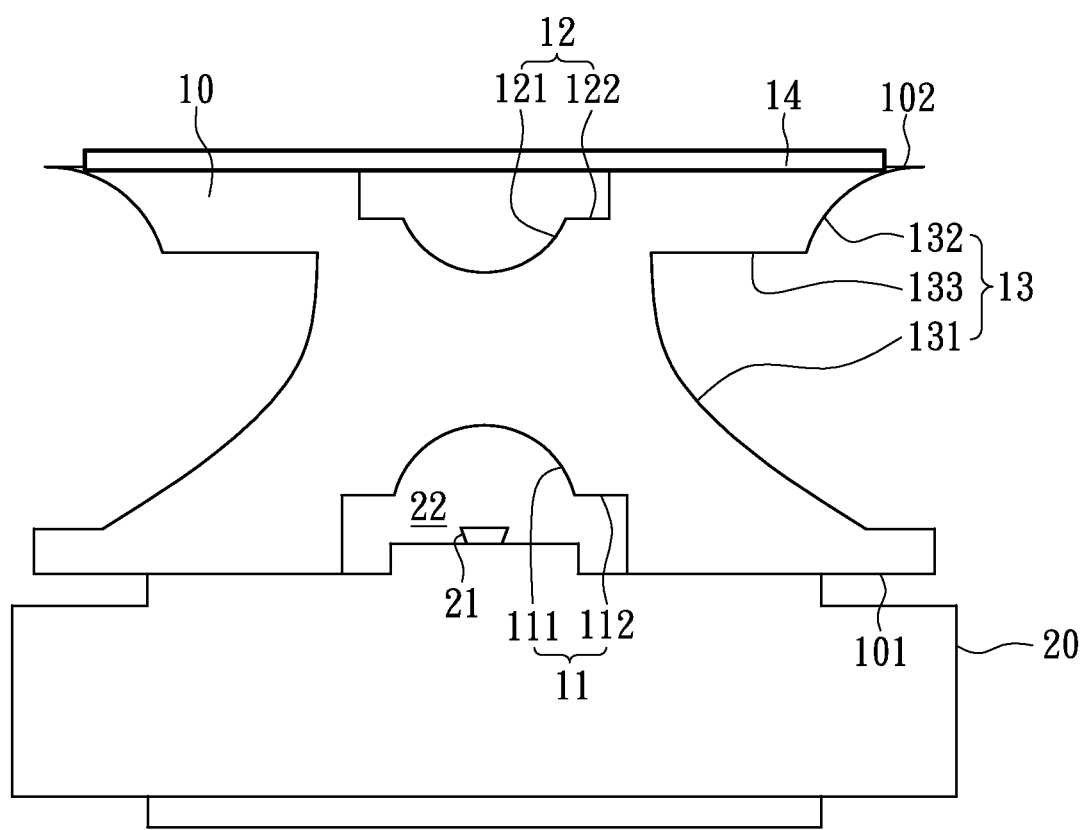
FIG. 4 shows that the lens body of the second embodiment is assembled with the base and the lighting element to form the lighting apparatus of the instant disclosure.

Please refer to FIG. 4; the instant lighting apparatus is shown. A lighting element 21, such as an LED is disposed on the base 20 and the optical lens module 1 is assembled on the base 20. The optical lens module 1 of the above second embodiment is assembled on the base 20, which is shown in FIG. 4. The incident surface 11 corresponds to the lighting element 21; preferably, the lighting element 21 is located on the focus point of the arc-surface 111. A receiving compartment 22 corresponding to the incident surface 11 is defined between the lens body 10 and the base 20. A first medium having smaller refractive index smaller than the lens body 10 is filled into the receiving compartment 22, and a second medium having smaller refractive index smaller than the lens body 10 is filled into the space defined between the lens body 10 and the transflective unit 14. While passing through the boundary between the optically denser medium (i.e., the lens body 10) and the optically thinner medium (i.e., the first or the second medium), the transmitted angle is a larger angle with respect to the central axis 100 so that the light travels through the lens body 10 into the air (i.e., environment) passing through the lateral portion of the lens body 10. Therefore, the light has a uniform light pattern and a greater view angle. In other words, the lighting apparatus performs an Omni directional distribution.

Please note that the optical lens module 1 of the above first and third embodiments may also be applied to the lighting apparatus. The optical lens module 1 may be locked, welded or adhesive bonded to the base 20, but not restricted thereby. The present invention has at least the following advantages:

Firstly, the present invention can solve the problem of uneven illumination of the light due to directional light sources. In other words, the present invention utilizes the transflective unit and the structure of the lens body to achieve the object of floodlight illumination from directional light sources. In detail, the light emitted by the directional light source is reflected by the transflective unit and then be refracted out of the lens body through the lateral portion of the lens body. Accordingly, the present invention meets the requirement of floodlight illumination, for example, the diverged angle is ranged between ±90 degree and ±180 degree.

Secondly, the lighting apparatus of the present invention may not consume the energy of the light to achieve the uniform light pattern. For example, the light density between 0 degree and ±160 degree is 60% or more of the maximum intensity. In other words, the light density is uniform.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. An optical lens module comprising:
   a lens body having a central axis; wherein the lens body has an incident surface on the bottom portion thereof, a top refractive surface on the top portion thereof and a side refractive surface on the side portion thereof, the refractive top surface includes a refractive arc-surface and at least one auxiliary refractive surface formed on the side of the refractive arc-surface; and
   a transflective unit disposed on the lens body and covering the refractive top surface;
   wherein the light incident on the top refractive surface is diverged away from the central axis, the diverged light on the transflective unit is emitted partially through the transflective unit and partially reflected to travel out of the lens body through the side refractive surface;
   wherein the light directly incident on the transflective unit is reflected to travel out of the lens body through the side refractive surface; and
   wherein the light incident on the side refractive surface is refracted out of the lens body through the side refractive surface.

2. The optical lens module as claimed in claim 1, wherein the incident surface at least has an arc-surface.

3. The optical lens module as claimed in claim 2, wherein the incident surface is an interface defined between the lens body and a first medium, and the refractive index of the lens body is greater than that of the first medium.

4. The optical lens module as claimed in claim 2, wherein the top refractive surface is an interface defined between the lens body and a second medium, and the refractive index of the lens body is greater than that of the second medium.

5. The optical lens module as claimed in claim 2, wherein the incident surface further has at least one step structure having a single-stepped shape at the side of the arc-surface.

6. The optical lens module as claimed in claim 5, wherein the auxiliary refractive surface is a single-stepped structure.

7. The optical lens module as claimed in claim 6, wherein the side refractive surface is a smooth curved-surface extending from the bottom portion of the lens body to the top portion of the lens body.

8. The optical lens module as claimed in claim 6, wherein the side refractive surface has a first curved-surface extending from the bottom portion of the lens body toward the top portion of the lens body, a second curved-surface extending from the top portion of the lens body toward the bottom portion of the lens body and a horizontal connection segment between the first curved-surface and the second curved-surface.

9. The optical lens module as claimed in claim 2, wherein the incident surface further has at least one step structure having a two-stepped shape at the side of the arc-surface.

10. The optical lens module as claimed in claim 9, wherein the auxiliary refractive surface is a single-stepped structure, the top refractive surface further has a refractive protrusion between the refractive arc-surface and the auxiliary refractive surface.

11. The optical lens module as claimed in claim 10, wherein the side refractive surface has a first curved-surface extending from the bottom portion of the lens body toward the top portion of the lens body, a first horizontal connection segment extending from the first curved-surface, a second curved-surface extending from the top portion of the lens body toward the bottom portion of the lens body and a second horizontal connection segment extending from the second curved-surface and a third curved-surface connected between the first horizontal connection segment and the second horizontal connection segment.

12. The optical lens module as claimed in claim 1, wherein the incident surface has rotational symmetry with respect to the central axis, the refractive top surface has rotational symmetry with respect to the central axis and the side refractive surface has rotational symmetry with respect to the central axis.

13. The optical lens module as claimed in claim 1, wherein the transflective unit at least includes a metallic film or a dielectric film.

14. The optical lens module as claimed in claim 1, wherein the transflective unit has a reflective ratio ranged from 30% to 60%.

15. The optical lens module as claimed in claim 14, wherein the transflective unit has a reflective ratio of 55%.

16. A lighting apparatus, comprising;
   a base having a lighting element thereon;
   an optical lens module assembled on the base and corresponding to the lighting element, the optical lens module comprising;
      a lens body having a central axis; wherein the lens body has an incident surface on the bottom portion thereof, a top refractive surface on the top portion thereof and a side refractive surface on the side portion thereof, the refractive top surface includes a refractive arc-surface and at least one auxiliary refractive surface formed on the side of the refractive arc-surface; and
      a transflective unit disposed on the lens body and covering the top refractive surface;
   wherein the light emitted by the lighting element and incident on the top refractive surface is diverged away from the central axis, the diverged light on the transflective unit is emitted partially through the transflective unit and partially reflected to travel out of the lens body through the side refractive surface; and wherein the light emitted by the lighting element and directly incident on the transflective unit is reflected to travel out of the lens body through the side refractive surface; and wherein the light emitted by the lighting element and incident on the side refractive surface is refracted out of the lens body through the side refractive surface.

17. The lighting apparatus as claimed in claim 16, wherein the incident surface at least has an arc-surface, the lighting element is located at the focus point of the arc-surface.

18. The lighting apparatus as claimed in claim 17, wherein the lens body and the base define a receiving compartment corresponding to the incident surface, a first medium is filled into the receiving compartment, the incident surface is an interface defined between the lens body and the first medium, and the refractive index of the lens body is greater than that of the first medium.

19. The lighting apparatus as claimed in claim 17, wherein the lens body and the transflective unit define a space therebetween, a second medium is filled into the space, the top refractive surface is an interface defined between the lens body and the second medium, and the refractive index of the lens body is greater than that of the second medium.

20. The lighting apparatus as claimed in claim 17, wherein the incident surface further has at least one step structure having a single-stepped shape at the side of the arc-surface.

21. The lighting apparatus as claimed in claim 20, wherein the auxiliary refractive surface is a single-stepped structure.

22. The lighting apparatus as claimed in claim 21, wherein the side refractive surface is a smooth curved-surface extending from the bottom portion of the lens body to the top portion of the lens body.

23. The lighting apparatus as claimed in claim 21, wherein the side refractive surface has a first curved-surface extending from the bottom portion of the lens body toward the top portion of the lens body, a second curved-surface extending from the top portion of the lens body toward the bottom portion of the lens body and a horizontal connection segment between the first curved-surface and the second curved-surface.

24. The lighting apparatus as claimed in claim 17, wherein the incident surface further has at least one step structure having a two-stepped shape at the side of the arc-surface.

25. The lighting apparatus as claimed in claim 24, wherein the auxiliary refractive surface is a single-stepped structure, the top refractive surface further has a refractive protrusion between the refractive arc-surface and the auxiliary refractive surface.

26. The lighting apparatus as claimed in claim 25, wherein the side refractive surface has a first curved-surface extending from the bottom portion of the lens body toward the top portion of the lens body, a first horizontal connection segment extending from the first curved-surface, a second curved-surface extending from the top portion of the lens body toward the bottom portion of the lens body and a second horizontal connection segment extending from the second curved-surface and a third curved-surface connected between the first horizontal connection segment and the second horizontal connection segment.

27. The lighting apparatus as claimed in claim 16, wherein the incident surface has rotational symmetry with respect to the central axis, the refractive top surface has rotational symmetry with respect to the central axis and the side refractive surface has rotational symmetry with respect to the central axis.

28. The lighting apparatus as claimed in claim 16, wherein the transflective unit at least includes a metallic film or a dielectric film.

29. The lighting apparatus as claimed in claim 16, wherein the transflective unit has a reflective ratio ranged from 30% to 60%.

30. The lighting apparatus as claimed in claim 29, wherein the transflective unit has a reflective ratio of 55%.

* * * * *